(12) United States Patent
Shinbara et al.

(10) Patent No.: US 6,273,104 B1
(45) Date of Patent: Aug. 14, 2001

(54) METHOD OF AND APPARATUS FOR PROCESSING SUBSTRATE

(75) Inventors: Kaoru Shinbara; Atsuro Eitoku; Katsuyuki Miyake, all of Shiga (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 08/645,648

(22) Filed: May 16, 1996

(30) Foreign Application Priority Data

May 18, 1995 (JP) .................................................. 7-119953

(51) Int. Cl.[7] ...................................................... B08B 3/02
(52) U.S. Cl. ........................... 134/25.4; 134/33; 134/148; 134/157; 134/183; 134/902; 134/102.1
(58) Field of Search ..................................... 134/902, 157, 134/25.4, 33, 140, 148, 153, 182, 183, 100.1, 102.1; 118/52, 318, 319, 320; 438/689; 156/345; 216/92, 90

(56) References Cited

U.S. PATENT DOCUMENTS

| | | | |
|---|---|---|---|
| 3,953,265 | * | 4/1976 | Hood . |
| 4,021,278 | * | 5/1977 | Hood et al. . |
| 4,339,297 | * | 7/1982 | Aigo . |
| 4,350,562 | * | 9/1982 | Bonu . |
| 4,485,758 | * | 12/1984 | Peugh et al. . |
| 4,544,439 | * | 10/1985 | Solomon et al. ..................... 156/626 |
| 4,544,446 | * | 10/1985 | Cady ..................... 156/639 |
| 4,564,280 | * | 1/1986 | Fukuda ..................... 354/317 |
| 4,718,975 | * | 1/1988 | Bowling et al. . |
| 4,788,994 | * | 12/1988 | Shinbara ..................... 134/157 |
| 4,790,262 | * | 12/1988 | Nakayama et al. ..................... 118/52 |
| 4,790,567 | | 12/1988 | Kawano et al. . |
| 4,903,717 | * | 2/1990 | Sumnitsch ..................... 134/99 |
| 5,209,180 | * | 5/1993 | Shoda et al. ..................... 118/52 |
| 5,375,291 | * | 12/1994 | Tateyama et al. ..................... 15/302 |
| 5,395,649 | * | 3/1995 | Ikeda . |
| 5,558,110 | * | 9/1996 | Williford, Jr. ..................... 134/56 R |
| 5,706,843 | * | 1/1998 | Matsuo ..................... 134/153 |
| 5,720,814 | * | 2/1998 | Takagi et al. ..................... 118/319 |
| 5,762,708 | * | 6/1998 | Motoda et al. ..................... 118/52 |
| 5,803,970 | * | 9/1998 | Tateyama et al. ..................... 118/319 |
| 5,927,303 | * | 7/1999 | Miya et al. ..................... 134/148 |
| 5,979,475 | * | 11/1999 | Satoh et al. . |

FOREIGN PATENT DOCUMENTS

| | | |
|---|---|---|
| 4-243741 | 8/1992 | (JP) . |
| 5-20321 | 3/1993 | (JP) . |

* cited by examiner

*Primary Examiner*—Frankie L. Stinson
(74) *Attorney, Agent, or Firm*—Ostrolenk, Faber, Gerb & Soffen, LLP (57) ABSTRACT

A blocking plate is disposed to face a substrate which is held by substrate holding device. A processing fluid is supplied to a surface of the substrate while supplying inert gas into a space between the substrate and the blocking plate. Since the inert gas flows along the surface of the substrate within the space between the substrate and the blocking plate, no turbulence which whirls upward is created at the surface of the substrate. This prevents the pollutants from adhering to the substrate and improves the quality of the substrate.

31 Claims, 8 Drawing Sheets

METHOD OF AND APPARATUS FOR PROCESSING SUBSTRATE

BACKGROUND OF THE INVENTION

1. Field of the Invention

The present invention relates to a method of and an apparatus for processing a semiconductor substrate, a liquid crystal glass substrate, or the like (hereinafter referred to simply as "substrate").

2. Description of the Background Art

Various types of treatments are performed on a substrate during steps of manufacturing a semiconductor substrate, a liquid crystal glass substrate, etc. The treatments include coating of a substrate with a photoresist, stripping of a photoresist, cleaning after stripping of a photoresist, etc. In the following, a description will be given of a substrate processing apparatus for cleaning a substrate, with reference to FIG. 11 which shows an essential cross sectional view of the substrate processing apparatus. The illustrated substrate processing apparatus is an apparatus proposed in Japanese Utility Model Application Laid-Open Gazette No. 5-20321.

Figure 11:
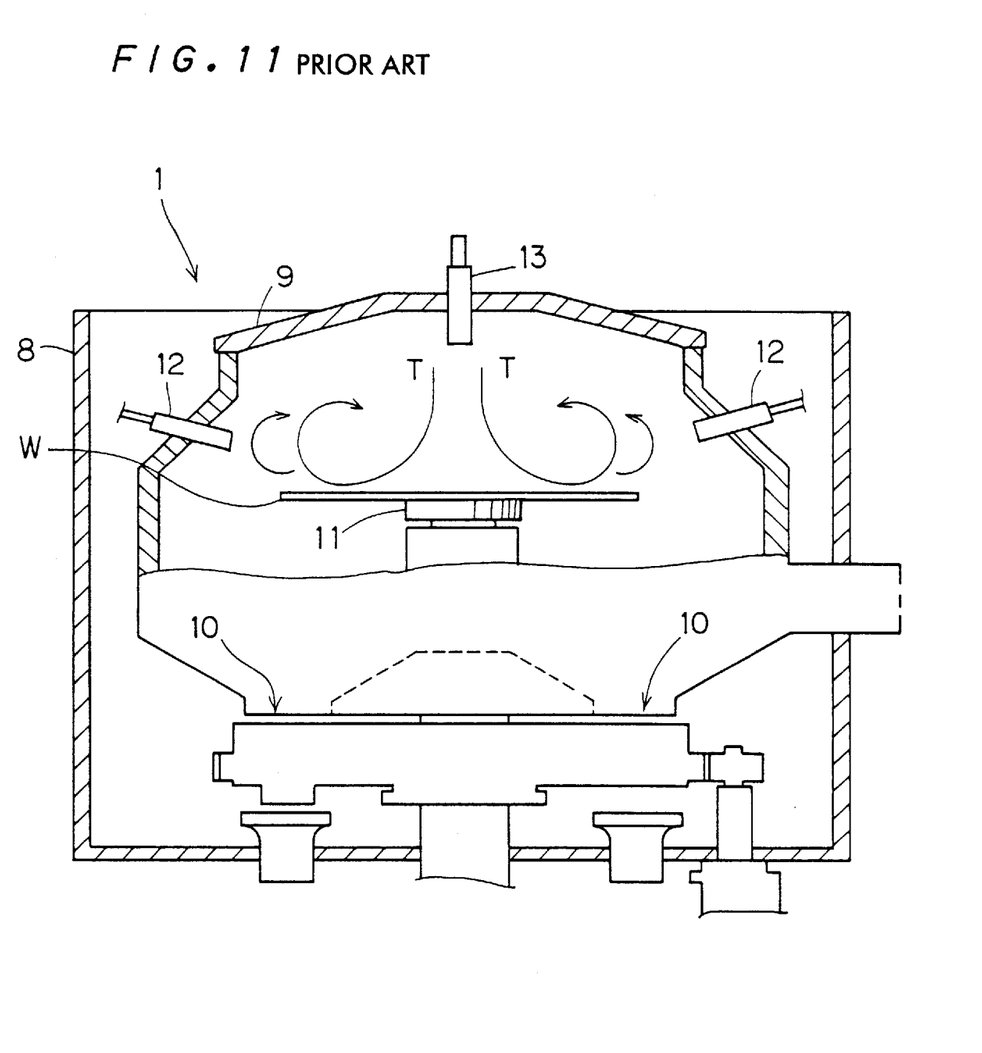
FIG. 11 is an essential notched perspective view of a conventional substrate processing apparatus.

A substrate processing apparatus 1 uses a chemical liquid, such as fluoric acid, and de-ionized water as a cleaning fluid to clean a substrate.

The substrate processing apparatus 1 includes a chamber 9 within a box-like member 8. A drain outlet 10 for draining the cleaning fluid is disposed in a lower portion of the chamber 9. The chamber 9 houses substrate holding means 11 for holding, by suction, a substrate W. The substrate holding means 11 is rotated by rotating means (not shown). Further, the chamber 9 houses a cleaning fluid injecting nozzle 12 for supplying the cleaning fluid onto the substrate W and a gas supply nozzle 13 for supplying inert gas into the chamber 9.

Processing of the substrate W within the substrate processing apparatus 1 is subsequently described. First, the substrate W is placed on the substrate holding means 11, and the substrate holding means 11 holds, by suction, the substrate W. Next, the substrate holding means 11 is rotated by the rotating means. On the other hand, the gas supply nozzle 13 gushes inert gas toward the substrate W so that an area in the vicinity of a surface of the substrate W is filled with the inert gas. This is to ensure that the substrate W is processed in the atmosphere which does not contain air but is filled with the inert gas, to thereby prevent an undesirable oxide film from forming on the substrate W. Further, the cleaning fluid injecting nozzle 12 gushes the cleaning fluid toward the substrate W which is being rotated. Hence, the substrate W is cleaned with the cleaning fluid within the atmosphere with the inert gas. Excess of the cleaning fluid dripping from the substrate W is drained through the drain outlet 10 which is disposed in a lower portion of the chamber 9.

Further, an apparatus disclosed in U.S. Pat. No. 790,567 includes a chamber which contains a substrate holding means for holding a substrate, a fluid flow guide arranged in the upper part of the substrate holding means so as to face a substrate, and a central conduit arranged in the center of the fluid flow guide.

In the substrate processing apparatus described above, a processing fluid is supplied through the central conduit to the surface of the substrate. After the fluid supply stops, an inert gas is supplied to the surface of the substrate, to prevent the substrate from being polluted by air.

In the conventional substrate processing apparatus 1, as the substrate W is rotated, an air flow which whirls upward is created at the surface of the substrate W, as shown in FIG. 11, resulting in a turbulence T. The turbulence T disturbs pollutants within the chamber 9 and causes the pollutants to adhere to the substrate W. As a result, the quality of the substrate is inconveniently deteriorated.

Further, while the gas supply nozzle 13 blows the inert gas toward the substrate W to prevent formation of an oxide film, a large space above the substrate W causes a large quantity of air to be included in the inert gas when the inert gas reaches the substrate W. For this reason, it is necessary to supply a large quantity of the inert gas to minimize air which exists near the surface of the substrate W, which leads to an increase in the opperating cost of the apparatus.

Further, while the processing fluid is supplied to the surface of a substrate and directly after the supply stops, an inert gas film cannot be formed. For this reason, an oxide film is likely to be formed on the surface of a substrate by being exposed to air.

SUMMARY OF THE INVENTION

The present invention is directed to a method of processing a substrate.

According to the present invention, the method comprises the steps of: a) providing a plate member; b) rotating a substrate at a position facing the plate member; c) generating a flow of inert gas in a space between the substrate and the plate member; and d) generating a flow of liquid between the substrate and the flow of the inert gas.

Preferably, the step d) includes the step of: d-1) supplying the liquid toward a center of the substrate.

In a preferred embodiment of the present invention, the plate member has a window in which a nozzle is provided, the step c) includes the step of: c-1) supplying the inert gas to the space through the window, and the step d-1) includes the step of: d-1-1) supplying the liquid to the space through the nozzle.

In another preferred embodiment of the present invention, the step c) includes the step of: c-1) supplying the inert gas to the space through a plurality of through holes distributed in the plate member, and the step d-1) includes the step of: d-1-1) supplying the liquid to the space through a nozzle attached to a center of the plate member.

The present invention also concerns an apparatus adapted for the above-described method.

Accordingly, an object of the present invention is to prevent creation of an air flow which whirls upward from a surface of a substrate, so that it is possible to prevent pollutants around the substrate from adhering to the substrate and thereby to improve the quality of the substrate.

Another object of the present invention is to reduce the quantity of inert gas required to lessen the affect of air at the surface of a substrate, thereby to lower the operating cost of the apparatus.

It is another object of the present invention to perform a uniform processing of a substrate by spreading an inert gas and a processing fluid uniformly from the center of a substrate toward the periphery of a substrate so that it is possible to improve the quality of a substrate.

It is still another object of the present invention to supply inert gas onto a surface of a substrate while supplying a processing fluid onto a substrate, as well by providing a processing fluid supply nozzle and an inert gas supply nozzle independently, so that it is possible to prevent a substrate from being exposed to air during and after its exposure to the processing fluid.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

A substrate processing apparatus according to the present invention is described with reference to the associated drawings. The substrate processing apparatus described below supplies de-ionized water, i.e., a cleaning fluid, as a processing fluid onto a substrate to thereby perform cleaning, and also dries the substrate.

Figure 1:
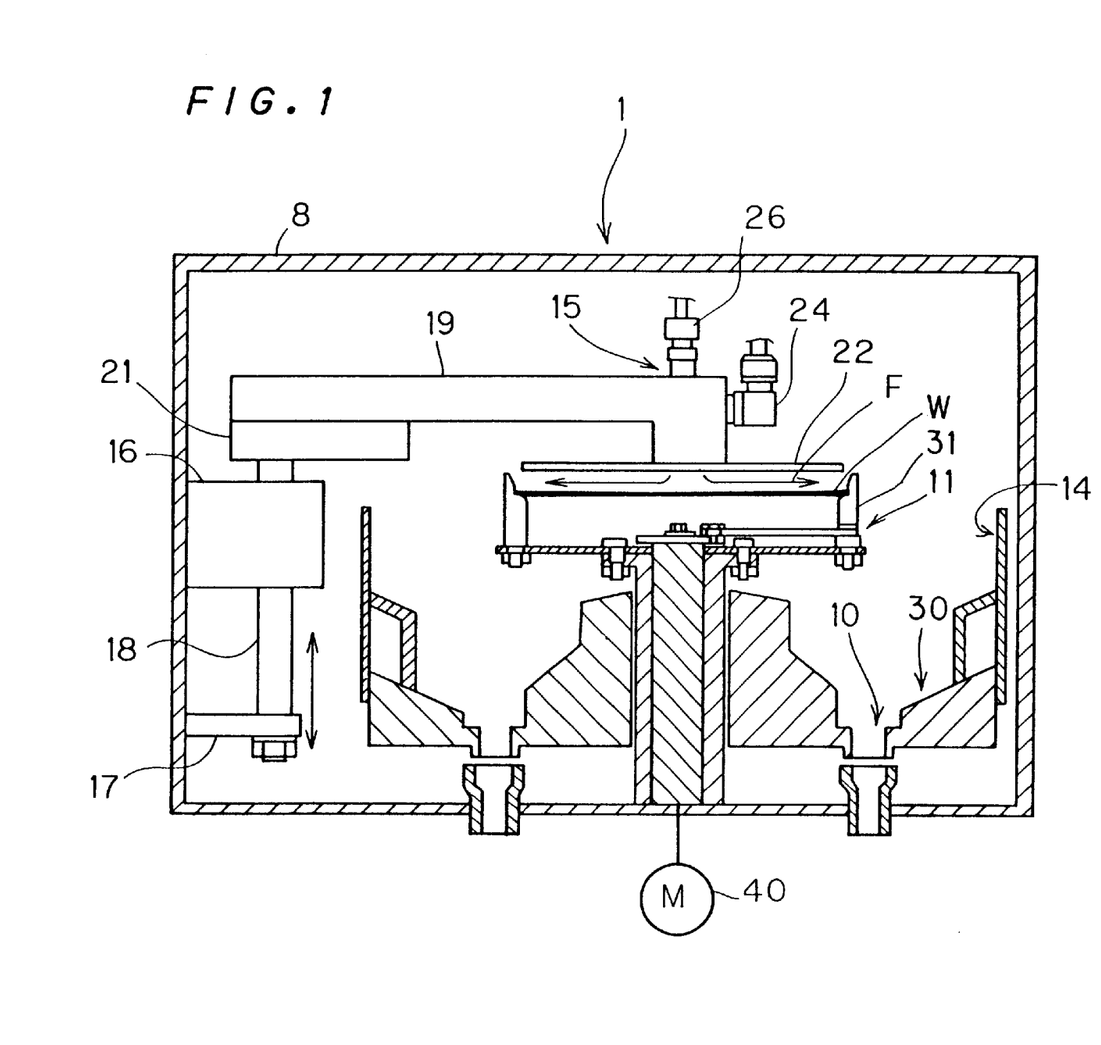
FIG. 1 is a vertical cross sectional view of a substrate processing apparatus according to a first preferred embodiment of the present invention.
Figure 2:
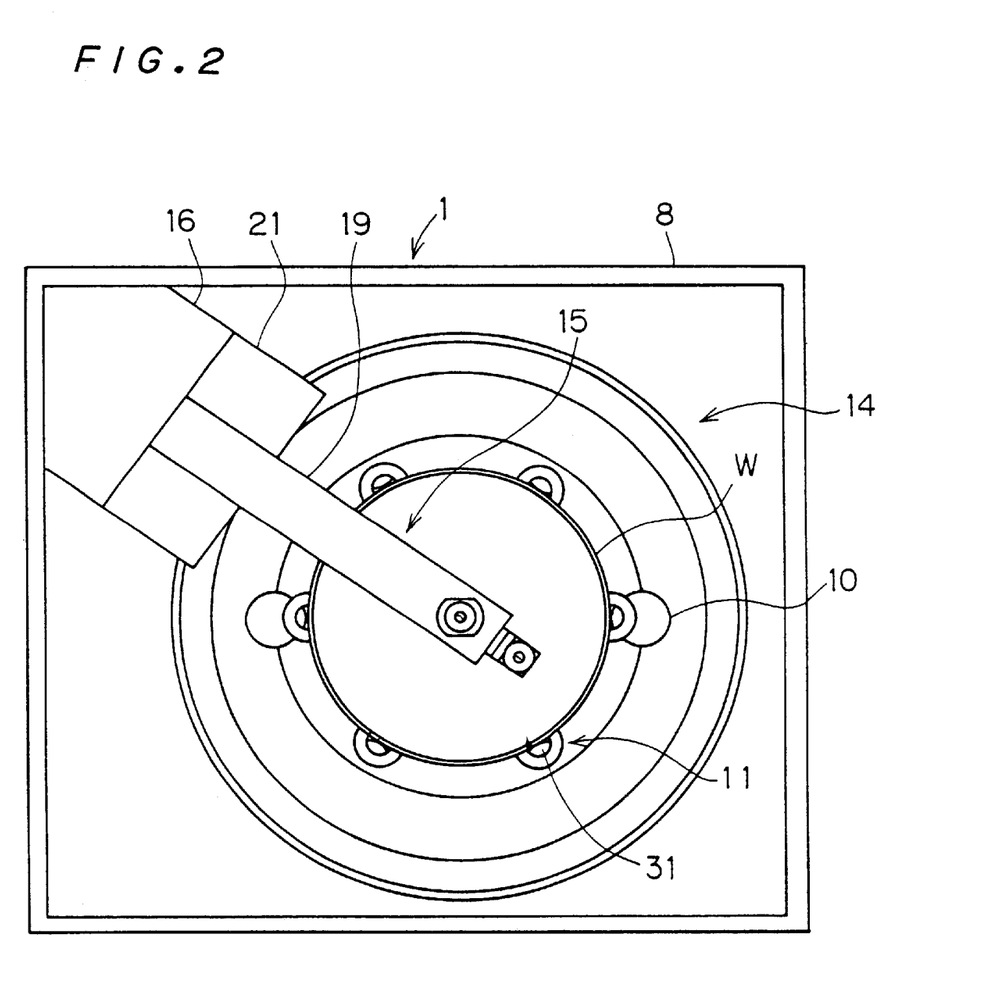
FIG. 2 is a top view of the substrate processing apparatus according to the first preferred embodiment of the present invention.

FIG. 1 is a vertical cross sectional view of the substrate processing apparatus according to a first preferred embodiment of the present invention, and FIG. 2 is a top view of the substrate processing apparatus. Referring to FIGS. 1 and 2, a substrate processing apparatus 1 includes a cup 14 within a box-like member 8. The cup 14 is a bowl-like shaped member which looks like a circle when viewed from above. A valley-like portion 30 is formed successively in a circumferential direction in a bottom portion of the cup 14. Two drain outlets 10 are formed in the valley-like portion 30, so that a cleaning fluid dripping into the cup 14 is drained through the drain outlets 10. Substrate holding device 11 is disposed so as to be at the center of the cup 14. The substrate holding device 11 is rotated by a motor 40. The substrate holding device 11 includes a plurality of pins 31 so that the pins 31 hold the substrate W at the periphery of the substrate W. Further, blocking device 15 is disposed to face the substrate W. The blocking device 15 is moved upward and downward by a fixed block 16 which includes a driving mechanism inside.

Next, the blocking device 15 is described.

Figure 3:
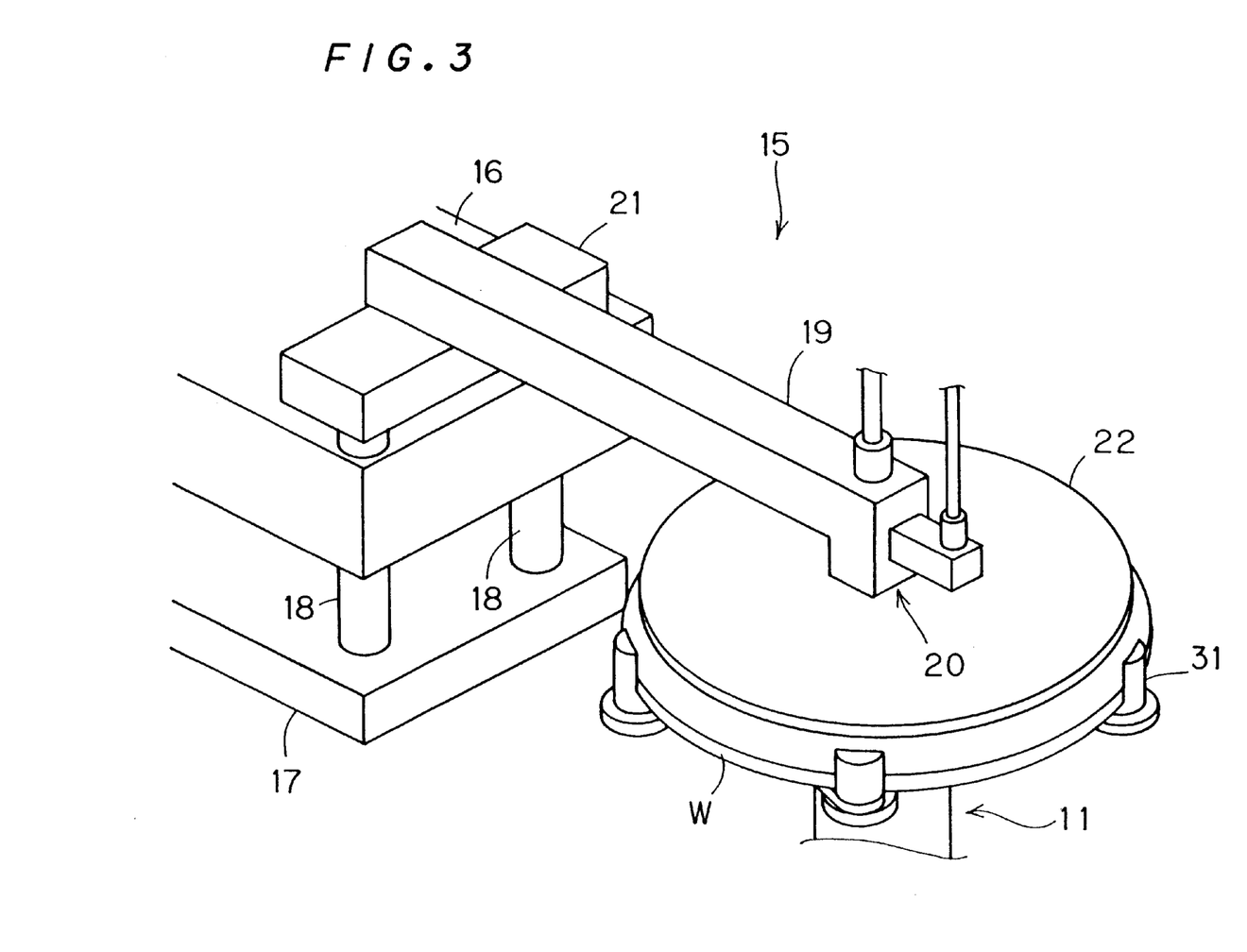
FIG. 3 is a perspective view of a blocking device according to the first preferred embodiment of the present invention.
Figure 4:
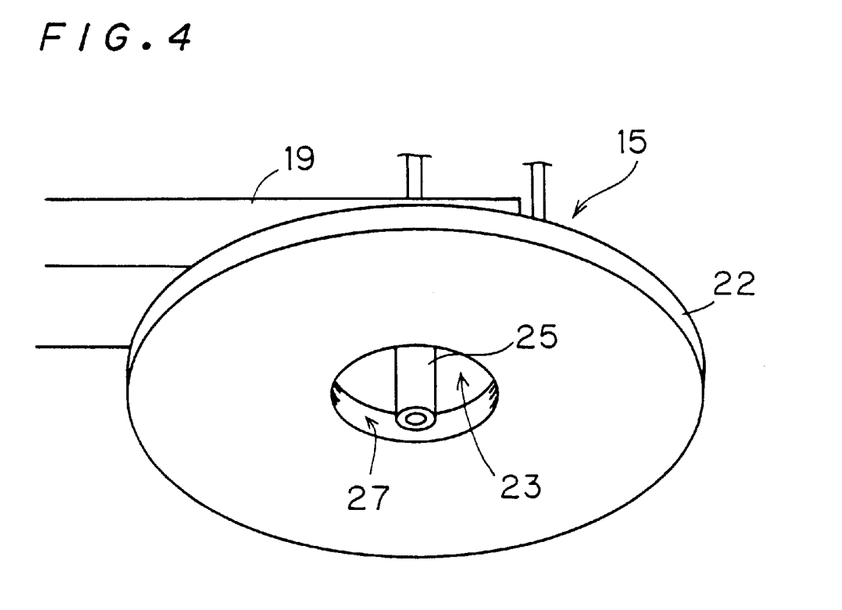
FIG. 4 is a partial view of the blocking device according to the first preferred embodiment of the present invention.

FIG. 3 is a perspective view of the blocking device 15 which is shown in FIGS. 1 and 2, and FIG. 4 is a perspective view of a portion of the blocking device 15. In FIG. 3, fixed block 16 is fixed to the apparatus itself. Two slidable columns 18, 18 penetrate the fixed block 16 in a vertical direction. The slidable columns 18, 18 are moved upward and downward by the driving mechanism of the fixed block 16. Bottom ends of the slidable columns 18, 18 are fixed to a movable block 17. The movable block 17 is moved upward and downward with the slidable columns 18, 18 by the driving mechanism. Further, an arm base 21 is fixed to top ends of the slidable columns 18, 18. A long arm 19, which extends in a horizontal direction, is fixed at one of ends to the arm base 21. A co-axial nozzle 20 is formed at the other end of the arm 19, and a blocking plate 22, which is a plate member, is fixed to the other end of the arm 19.

Since the blocking device 15 is of the above-described, as the slidable columns 18, 18 are moved upward by the driving mechanism the movable block 17 and hence the arm base 21, as well, are moved upward. This moves the arm 19 and the blocking plate upward. A distance between the blocking plate 22 and the substrate can be changed in this manner.

Figure 5:
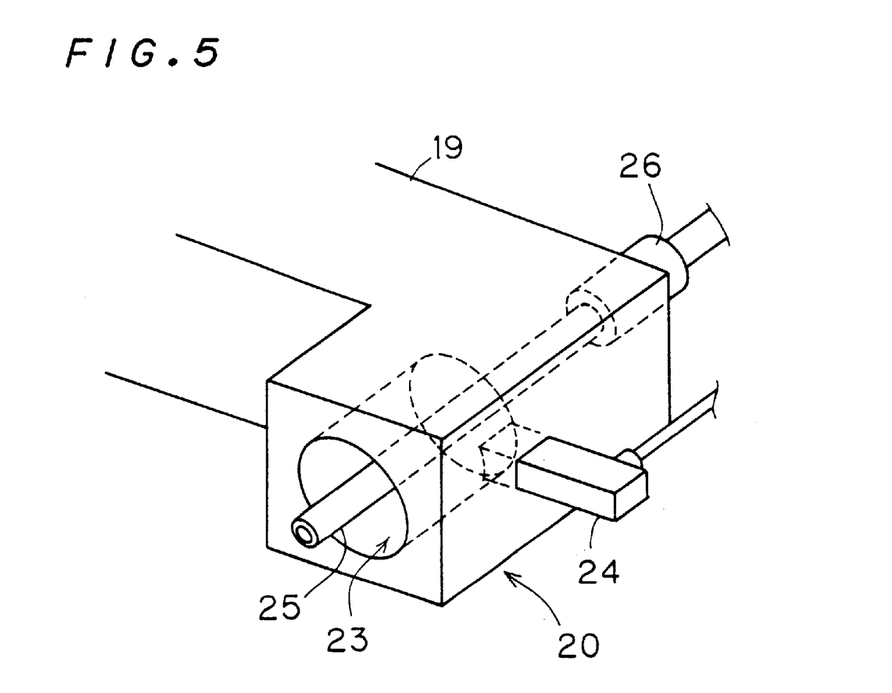
FIG. 5 is a perspective view of a co-axial nozzle according to the first preferred embodiment of the present invention.

The co-axial nozzle 20 is subsequently described with respect to FIG. 5. FIG. 5 is a perspective view of the co-axial nozzle 20 with the blocking plate 22 detached from the end of the arm 19. The end of the arm 19 is L-shaped, and a circle-shaped gas injecting outlet 23 for injecting inert gas, which corresponds to a first nozzle, is formed at a portion of the end of the arm 19 facing the substrate W. At the gas injecting outlet 23, the inert gas, namely nitrogen, is supplied from a bracket 24 which is disposed to penetrate the arm 19. Within the gas injecting outlet 23, a de-ionized water injecting nozzle 25, which corresponds to a second nozzle, is disposed coaxially with the gas injecting outlet 23. De-ionized water is supplied to the de-ionized water injecting nozzle 25, through a bracket 26.

Having a structure as described above, the co-axial nozzle 20 can inject nitrogen and de-ionized water to approximately the same portion of the substrate W.

The blocking plate 22 is described next, with reference to FIG. 4.

The blocking plate 22 is a disk-shaped member made of a polyvinyl chloride resin (PVC) and includes a circular opening 27, and corresponds to a window at the center. While the diameter of the blocking plate 22 may be approximately the same as or larger than the diameter of the substrate W, in this embodiment, the diameter of the blocking plate 22 is a little smaller than the substrate W. (The diameter of the blocking plate 22 is 14.6 cm while the diameter of the substrate is 15.24 cm.) This ensures that the blocking plate 22 and the pins 31 of the substrate holding device 11 do not interfere with each other when a distance between the blocking plate 22 and the substrate W is shortened. The shape of the blocking plate 22 may not be a disk shape. Rather, the blocking plate 22 may be formed as a polygonal plate-like member.

The blocking plate 22 is fixed to the arm 19 so that the opening 27 corresponds to the gas injecting outlet 23 of the co-axial nozzle 20.

Since the blocking plate 22 is fixed to the arm 19, neither friction nor friction-induced dust results between the blocking plate 22 and the arm 19.

The operation of the above described substrate processing apparatus 1 is subsequently described.

First, in an initial state, the blocking device 15 is at the highest retrieval position. Transporting means (not shown) transfers the substrate W as it is held horizontal to the substrate holding device 11, and the substrate holding device 11 holds the substrate.

Next, the blocking device 15 is moved downward by the driving means. At this stage, a gap between the substrate W and the blocking plate 22 is 10 mm. Upon downward movement of the blocking device 15, cleaning is started.

Cleaning is performed in the following manner.

Nitrogen, which is an inert gas, is ejected from the gas injecting outlet 23 toward a central portion of the substrate W, so that a space between the substrate W and the blocking plate 22 is filled with nitrogen. Nitrogen is supplied at a flow rate of 50 NL/min. The substrate holding device 11 is then rotated by the motor 40, at a rotation speed of 200 rpm. Following this, the de-ionized water injecting nozzle 25 supplies de-ionized water onto the central portion of the substrate W, thereby removing pollutants at a surface of the substrate W.

At this stage, a gas flow F is created in the flow space located between the substrate W and the blocking plate 22 as shown in FIG. 1. The flow begins near the center of the substrate W and flows radially outward along the surface of the substrate W within the flow between the substrate W and the blocking plate 22 as a result, the gas flow F does not whirl up at the surface of the substrate W. The de-ionized water also flows in the flow space located between the substrate W and the gas flow F, to thereby rinse the substrate W. Like the gas flow, the water flow begins near the center of the substrate W and flows radially outward along the substrate W. This prevents pollutants around the substrate W from adhering to the substrate W.

Further, since only the flow space between the substrate W and the blocking plate 22 needs to be filled with nitrogen, the quantity of nitrogen which is needed to fill up the space around the substrate W is small.

Further, the gas flow F occupies the space around the substrate W with nitrogen and reduces air near the surface of the substrate W. This reduces the chance that an oxide film is formed at the surface of the substrate W.

Further, since nitrogen and de-ionized water are injected toward the center of the substrate W, de-ionized water runs uniformly from the center of the substrate W toward the periphery of the substrate W under the gas flow F, thereby making even cleaning possible.

De-ionized water cleaning the surface of the substrate W flows into the cup 14, and then drains through the valley-like portion 30 and the drain outlets 10.

Drying is performed after cleaning in the following manner.

First, the supply of de-ionized water from the de-ionized water injecting nozzle 25 is stopped while maintaining the flow of nitrogen from gas injecting outlet 23. Next, the blocking device 15 is moved further downward by the driving mechanism, reducing the space between the substrate W and the blocking plate 22. The space is 4 mm in this embodiment. The rotation speed of the substrate holding device 11 can be increased by the motor 40. The rotation speed is 3,300 rpm in this embodiment. Thus, de-ionized water remaining at the surface of the substrate W is spun off as the substrate W is rotated. Further, as nitrogen is injected toward the center of the substrate W, the substrate W is dried.

At this stage, since fresh and dry nitrogen is always supplied from the center toward the periphery of the substrate W, drying is promoted.

The dried substrate W is transported outside the substrate processing apparatus 1, by the transporting means.

Second Preferred Embodiment

Figure 6:
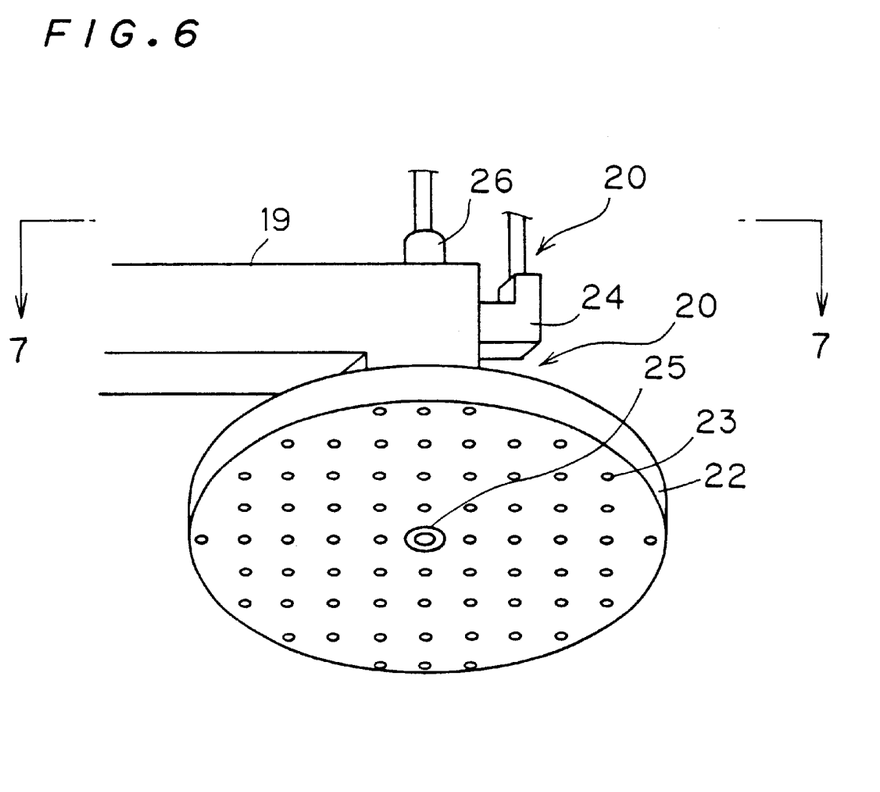
FIG. 6 is a perspective view of a blocking device according to a second preferred embodiment of the present invention.
Figure 7:
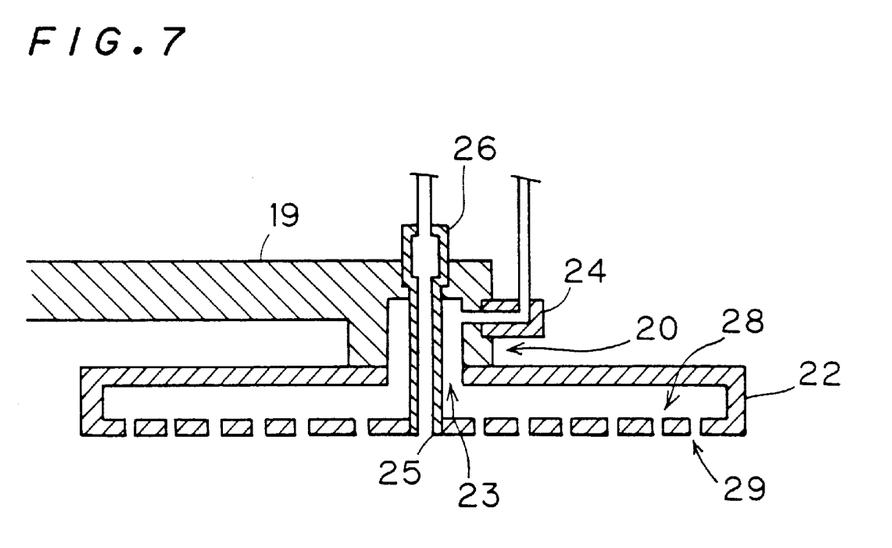
FIG. 7 is a vertical cross sectional view of the blocking means according to the second preferred embodiment of the present invention.

FIG. 6 is a perspective view of the blocking device 15 according to a second preferred embodiment of the present invention, and FIG. 7 is a cross sectional view of FIG. 6 taken along A—A line.

In FIGS. 6 and 7, the blocking plate 22 is disposed at a tip portion of the co-axial nozzle 20 which is fixed to the end of the arm 19. As shown in FIG. 7, the blocking plate 22 is a disk-shaped member which includes a hollow room 28 inside. A plurality of gas injection holes 29 are formed in a surface of the blocking plate 22 which faces the substrate W.

The de-ionized water injecting nozzle 25 of the co-axial nozzle 20, which penetrates the center of the blocking plate 22, supplies de-ionized water onto the substrate W. Meanwhile, the gas injecting outlet 23 of the co-axial nozzle 20 is linked to the hollow room 28, so that nitrogen from the gas injecting outlet 23 is allowed into the hollow room 28 and then injected toward the substrate W through the gas injection holes 29.

Third Preferred Embodiment

Figure 8:
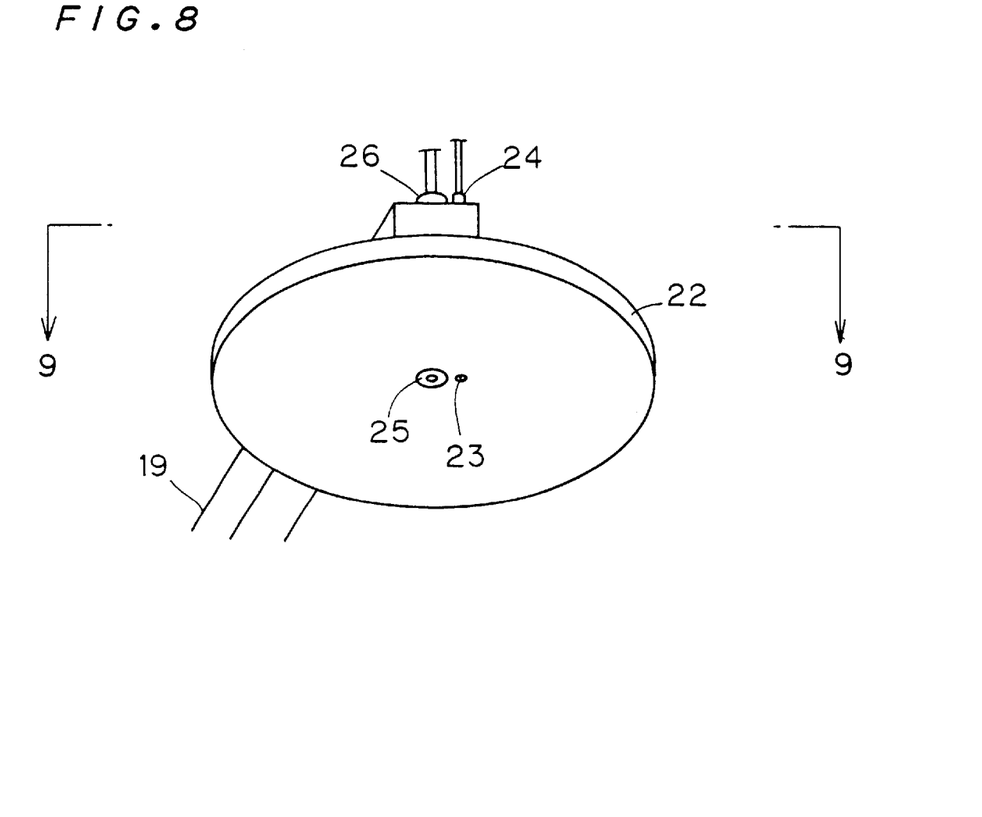
FIG. 8 is an essential perspective view of a blocking device according to a third preferred embodiment of the present invention.
Figure 9:
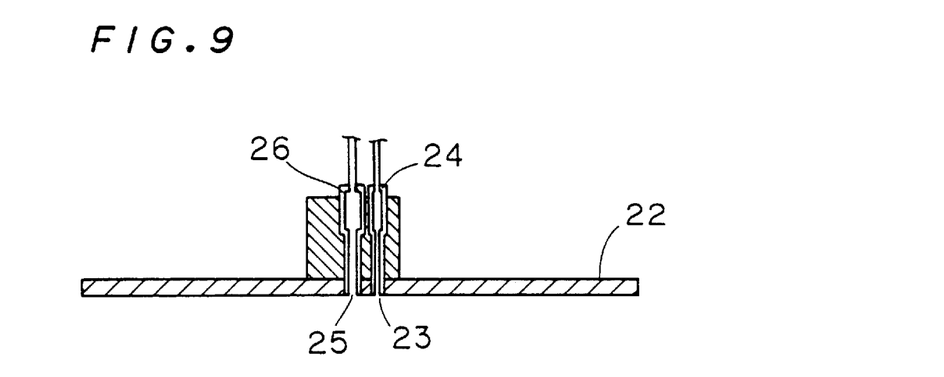
FIG. 9 is a vertical cross sectional view of the blocking device according to the third preferred embodiment of the present invention.

FIG. 8 is a perspective view of the blocking device 15 according to a third preferred embodiment of the present invention, and FIG. 9 is a cross sectional view of FIG. 8 taken along B—B line.

In FIGS. 8 and 9, the blocking plate 22, which is formed in a disk shape, is fixed to the end of the arm 19. The de-ionized water injecting nozzle 25 is disposed to penetrate the arm 19 and the center of the blocking plate 22. Further, beside the de-ionized water injecting nozzle 25 of the blocking plate 22, the gas injecting outlet 23 is also disposed to penetrate the arm 19 and the blocking plate 22.

In the third preferred embodiment, the de-ionized water injecting nozzle 25 and the gas injecting outlet 23 are not coaxial with each other. Rather, the de-ionized water injecting nozzle 25 and the gas injecting outlet 23 are disposed next to each other. Hence, the structure is simple and a manufacturing cost of the apparatus is cheap.

Fourth Preferred Embodiment

Figure 10:
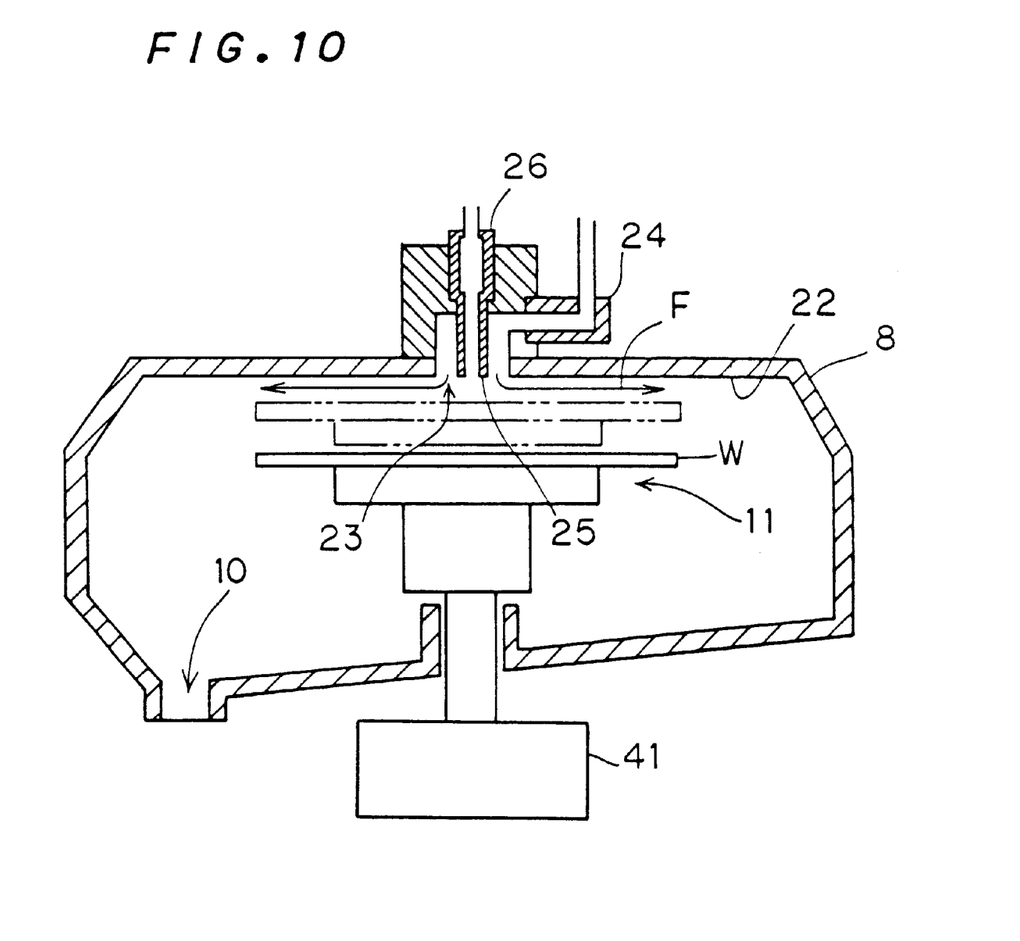
FIG. 10 is a vertical cross sectional view of a substrate processing apparatus according to a fourth preferred embodiment of the present invention.

FIG. 10 is a vertical cross sectional view of the substrate processing apparatus according to a fourth preferred embodiment of the present invention. An upper portion of the box member 8 is the blocking plate 22 which faces the substrate W. Further, the de-ionized water injecting nozzle 25 and the gas injecting outlet 23 are disposed in the upper portion of the box member 8. The substrate holding device 11 inside the box member 8 sucks, holds and rotates the substrate W. The substrate holding device 11 is moved upward and downward by rotating and vertical moving device 41, thereby changing the space between the substrate W and the blocking plate 22.

An operation of the substrate processing apparatus I according to the fourth preferred embodiment of the present invention is subsequently described.

First, in an initial state, the substrate holding device 11 is at the lowest retrieval position. Transporting means (not shown) transfers the substrate W as it is held horizontal to the substrate holding device 11, and the substrate holding device 11 holds the substrate.

Next, the substrate holding device 11 is moved upward, thereby adjusting the space between the substrate W and the blocking plate 22 to a certain value. Cleaning is then performed. Upon cleaning, the space between the substrate W and the blocking plate 22 is reduced, which is followed by drying. The dried substrate W is transported outside the substrate processing apparatus 1, by the transporting means. The space between the substrate W and the blocking plate 22 during cleaning and drying and the rotation speed at which the substrate W is rotated remain the same as in the first preferred embodiment.

In the fourth preferred embodiment, since the box member 8 functions as the blocking plate 22 as well, means for supporting the blocking plate 22 is not necessary. Hence, a manufacturing cost of the apparatus is reduced.

While the invention has been described in detail, the foregoing description is in all aspects illustrative and not restrictive. It is understood that numerous other modifications and variations can be devised without departing from the scope of the invention.

What is claimed is:

1. A method of processing a substrate, comprising the steps of:
    a) providing a plate member;
    b) rotating a substrate at a position facing said plate member;
    c) generating a flow of inert gas in a space between said substrate and said plate member; and
    d) generating a flow of liquid between said substrate and said flow of said inert gas.

2. The method of claim 1, wherein the step d) includes the step of:
    d-1) supplying said liquid toward a center of said substrate.

3. The method of claim 2, wherein said plate member has a window in which a nozzle is provided,
    the step c) includes the step of:
        c-1) supplying said inert gas to said space through said window, and
    the step d-1) includes the step of:
        d-1-1) supplying said liquid to said space through said nozzle.

4. The method of claim 2, wherein the step c) includes the step of:
    c-1) supplying said inert gas to said space through a plurality of through holes distributed in said plate member,
    the step d-1) includes the step of:
        d-1-1) supplying said liquid to said space through a nozzle attached to a center of said plate member.

5. The method of claim 1, wherein the step b) includes the steps of:
    b-1) holding said substrate by a substrate holding device to reduce said space; and
    b-3) rotating said substrate with said substrate holding device.

6. The method of claim 1, further comprising the step of:
    e) drying said substrate while supplying said inert gas to said space after the steps c) and d).

7. The method of claim 6, wherein the step b) includes the steps of:
    b-1) holding said substrate by A substrate holding device;
    b-2) moving one of said plate member and said substrate holding device to adjust a space between said substrate and said plate member to a first distance; and
    b-3) rotating said substrate by said substrate holding device,
    the step e) includes the steps of:
        e-1) moving one of said plate member and said substrate holding device after the steps c) and d) to adjust said space to a second distance which is shorter than said first distance; and
        e-1) drying said substrate while supplying said inert gas to said space.

8. An apparatus for processing a substrate, comprising:
    a) a box member having a roof;
    b) substrate holding means provided in said box member for holding said substrate at a position facing said roof;
    c) gas supply device for generating a flow of inert gas in a space between said substrate and said roof; and
    d) liquid supply device for generating a flow of liquid between said substrate and said flow of said inert gas.

9. An apparatus for processing a substrate, comprising:
    a) a box member having a roof;
    b) substrate holding device provided in said box member for holding said substrate at a position facing said roof;
    c) gas supply device for generating a flow of inert gas in a space between said substrate and said roof; and
    d) liquid supply device for generating a flow of liquid between said substrate and said flow of said inert gas.

10. An apparatus for processing a substrate, comprising:
    a) a rotatable support for rotatably supporting a substrate;
    b) a non-rotatable plate member moveable into a position spaced from and substantially parallel to a surface of said substrate to form a flow space therebetween;
    c) a gas supply supplying a flow of inert gas in said flow space, said gas moving radially outward from a location substantially at the center of said substrate; and
    d) a liquid supply supplying a flow of liquid in said flow space, said liquid moving radially outward from a position substantially at the center of said substrate, said liquid flowing between said inert gas and said surface of said substrate.

11. The apparatus of claim 10, wherein said liquid supply includes:
    d-1) a center supply port for supplying said liquid toward a center of said substrate.

12. The apparatus of claim 11, wherein said gas supply includes:
    c-1) a first nozzle extending through an opening in said plate member through which said inert gas is supplied to said flow space, and
    said center supply port includes:
        d-1-1) a second nozzle, which extends through both said opening and said first nozzle, and through which said liquid is supplied to said flow space.

13. The apparatus of claim 12, wherein said first nozzle is co-axial with said second nozzle.

14. The apparatus of claim 13, wherein said first and second nozzles are disposed over said center of said substrate.

15. The apparatus of claim 14, wherein said first nozzle supplies said inert gas in a vertically downward direction and said second nozzle supplies said liquid in a vertically downward direction.

16. The apparatus of claim 11, wherein said gas supply includes:
    c-1) a first nozzle for supplying said inert gas through a plurality of through holes distributed in said plate member, and
    said center supply device includes:
        d-1-1) a second nozzle which opens at a center of said plate member and through which said liquid is supplied to said space.

17. The apparatus of claim 10, further comprising:
    e) a moving device for moving one of said plate member and said rotatable support to change the dimensions of said flow space.

18. The apparatus of claim 10, wherein said said substrate support includes:
   a-1) a plurality of pins each having a step at which a periphery of said substrate is supported, and
   said plate memberhas an external configuration that is smaller than an external configuration of said substrate.

19. The apparatus of claim 10, wherein said support rotates said substrate relative to said plate member.

20. The apparatus of claim 19, further including a cup in which said plate member is located, said plate member being out of contact with said cup.

21. The apparatus of claim 20, wherein said flow of inert gas through said flow space moves substantially parallel to said surface of said substrate.

22. The apparatus of claim 10, further including a cup in which said plate member is located, said plate member being out of contact with said cup.

23. The apparatus of claim 22, wherein said flow of inert gas through said flow space moves substantially parallel to said surface of said substrate.

24. The apparatus of claim 10, wherein said flow of inert gas through said flow space moves substantially parallel to said surface of said substrate.

25. The apparatus of claim 10, wherein said plate is moveable to adjust the distance from said substrate and thereby adjust the height of said flow space.

26. The apparatus of claim 25, further comprising means for moving said plate member into said position spaced from said substrate.

27. The apparatus of claim 26, wherein said moving means changes said flow space to define a first distance between said plate member and said substrate while said gas and liquid are flowing through said flow space and changes said first distance between said plate member and said substrate to define a second distance, smaller than said first distance, when said gas is flowing through said flow space and said liquid is not.

28. The apparatus of claim 10, wherein said support rotates said substrate on a vertically extending axis and said plate member is held stationary while said substrate is rotated.

29. The apparatus of claim 28, further comprising an arm extending over said substrate, said plate member being affixed to said arm.

30. The apparatus of claim 29, wherein said plate member has a surface facing said substrate, said surface of said plate member being substantially parallel to said surface of said substrate.

31. The apparatus of claim 30, wherein said plate member is disk-shaped.

* * * * *